United States Patent
Song

(10) Patent No.: US 7,477,081 B2
(45) Date of Patent: Jan. 13, 2009

(54) PRE-DRIVER CIRCUIT AND DATA OUTPUT CIRCUIT USING THE SAME

(75) Inventor: Ho Uk Song, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/737,622

(22) Filed: Dec. 16, 2003

(65) Prior Publication Data

US 2005/0046450 A1  Mar. 3, 2005

(30) Foreign Application Priority Data

Aug. 25, 2003  (KR) .................... 10-2003-0058628

(51) Int. Cl.
*H03K 3/00* (2006.01)
(52) U.S. Cl. .................. 327/108; 327/170; 326/27; 326/86; 326/87
(58) Field of Classification Search ................ 327/108, 327/112, 158; 326/85, 87, 91, 88
See application file for complete search history.

(56) References Cited

U.S. PATENT DOCUMENTS

| | | | | |
|---|---|---|---|---|
| 5,109,166 A | * | 4/1992 | Coburn et al. ............... | 327/129 |
| 5,448,529 A | * | 9/1995 | Reddy et al. ............. | 365/233.5 |
| 5,777,523 A | * | 7/1998 | Lee et al. ....................... | 331/74 |
| 5,821,783 A | * | 10/1998 | Torimaru et al. ............ | 327/108 |
| 6,122,492 A | * | 9/2000 | Sears ....................... | 455/127.1 |
| 6,359,483 B1 | * | 3/2002 | Watkins et al. .............. | 327/158 |
| 6,389,566 B1 | * | 5/2002 | Wagner et al. .............. | 714/726 |
| 6,459,652 B1 | * | 10/2002 | Lee et al. ..................... | 365/233 |
| 6,573,753 B1 | * | 6/2003 | Snyder ........................ | 326/87 |
| 6,639,432 B1 | * | 10/2003 | Williams ...................... | 327/70 |
| 6,794,909 B1 | * | 9/2004 | Urakami et al. ............. | 327/112 |
| 6,822,499 B2 | * | 11/2004 | Ebihara ....................... | 327/294 |
| 7,123,046 B2 | * | 10/2006 | Keeth ........................... | 326/26 |
| 2002/0011881 A1 | * | 1/2002 | Uenishi ....................... | 327/112 |
| 2003/0179842 A1 | * | 9/2003 | Kane et al. .................. | 375/376 |

FOREIGN PATENT DOCUMENTS

| | | |
|---|---|---|
| KR | 2003-1964 | 8/2003 |
| KR | 2003-20124 | 8/2006 |

* cited by examiner

*Primary Examiner*—Tuan T. Lam
*Assistant Examiner*—Hiep Nguyen
(74) *Attorney, Agent, or Firm*—Marshall, Gerstein & Borun LLP

(57) ABSTRACT

Provided is a pre-driver circuit having a pull-up unit for receiving a data signal, as an input, to output a logical High; a pull-down unit for receiving the data signal, as an input, to output a logical Low; and a control unit for using a control signal reflecting a process completion status to adjust a driving size of the pull-up unit and/or the pull-down unit. According to the present invention, slew of a waveform of an output data can be stably secured regardless of a process condition.

19 Claims, 5 Drawing Sheets

PRE-DRIVER CIRCUIT AND DATA OUTPUT CIRCUIT USING THE SAME

BACKGROUND

1. Field of the Invention

The present invention relates to a semiconductor device and, more particularly, to a pre-driver circuit and an output circuit using the same.

2. Discussion of Related Art

A conventional data output circuit will be described with reference to FIG. 1, which shows a block diagram schematically illustrating the configuration of a data output circuit having a pre-driver circuit in a related art.

A data signal that is outputted as a logical High or a logical Low is inputted to an off-chip driver circuit 100 and a pre-driver circuit 200 and a data signal (Dout) is then outputted through an output driver circuit 300.

The off-chip driver circuit 100 includes off-chip drivers 100-1 to 100-N. The respective off-chip drivers 100-1 to 100-N use the same data signal as one input and corresponding first to $N^{th}$ control signals as the other input. Each of the off-chip drivers 100-1 to 100-N functions to reflect a possible difference in the performance of devices according to process conditions performed. In the above, N is a natural number of 2 or more.

Meanwhile, each of the off-chip drivers of the off-chip driver circuit 100 is connected correspondingly to output drivers within the output driver circuit 300. If a corresponding off-chip driver is turned off, an output driver connected thereto is turned off, and if a corresponding off-chip driver is turned on, an output driver connected thereto is turned on.

The pre-driver circuit 200 receives the data signal (DATA) and then functions to pull up or pull down according to a logical level of the signal. The pre-driver circuit 200 drives a corresponding output driver within the output driver circuit 300.

If the off-chip driver circuit operates in a high frequency state, however, it is not technically easy for a waveform of each data signal that is outputted while passing through the pre-driver circuit to have an adequate slew rate. In particular, a difference in device characteristics depending on advanced process status makes controlling a slew rate at both conditions difficult. Accordingly, there is an urgent need to implement a circuit that can accomplish a stabilized operation at each data path, while satisfying a slew rate required by a system.

SUMMARY OF THE INVENTION

The present invention is directed to controlling a pre-driver drive strength according to a process completion condition of a wafer.

According to one preferred embodiment of the present invention, there is provided a pre-driver circuit, including a pull-up unit for receiving a data signal, as an input, to output a logical High, a pull-down unit for receiving the data signal, as an input, to output a logical Low, and a control unit for using a control signal reflecting a process completion status to adjust a drive strength of the pull-up unit and/or the pull-down unit.

It is preferred that the control signal is a signal to decide ON/OFF of off-chip drivers.

Preferably, if a process status is advantageous (FAST CONDITION), the pre-driver circuit is constructed so that a drive strength becomes smaller, and if the process status is disadvantageous (LOW CONDITION), the pre-driver circuit is constructed so that the drive strength becomes larger.

In the above, the pull-up unit may include a plurality of PMOSs each having a source and drain connected in parallel between a power supply voltage and an output terminal, and a gate connected to a data signal. The pull-down unit may include a plurality of NMOSs each having a source and drain connected in parallel between a ground voltage and the output terminal, and a gate connected to the data signal.

Meanwhile, the control unit may switch at least one PMOS of the number of the PMOSs and/or at least one NMOS of the number of the NMOSs, according to a logical status of the control signal.

Preferably, the control unit includes an inverter for inverting the control signal, and a transmission gate for switching the control signal and its inverse signal.

According to one preferred embodiment of the present invention, there is provided a data output circuit, including an off-chip driver circuit having first to $N^{th}$ off-chip drivers each for using a data signal and respective first to $N^{th}$ control signals, as an input, to determine whether to produce output signals according to corresponding control signals; a pre-driver circuit having a pull-up unit for receiving a data signal, as an input, to output a logical High, a pull-down unit for receiving the data signal, as an input, to output a logical Low, and a control unit for using at least one control signal of the first to $N^{th}$ control signals to adjust a drive strength of the pull-up unit and/or the pull-down unit; and an output driver circuit connected to outputs of the off-chip driver circuit and the pre-driver circuit.

Meanwhile, each of the off-chip drivers may perform an NAND operation for a corresponding control signal and the data signal when a logical status of the inputted data signal is High, and an NOR operation for an inverse signal of a corresponding control signal and the data signal when a logical status of the inputted data signal is Low.

DETAILED DESCRIPTION OF PREFERRED EMBODIMENTS

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Figure 1:
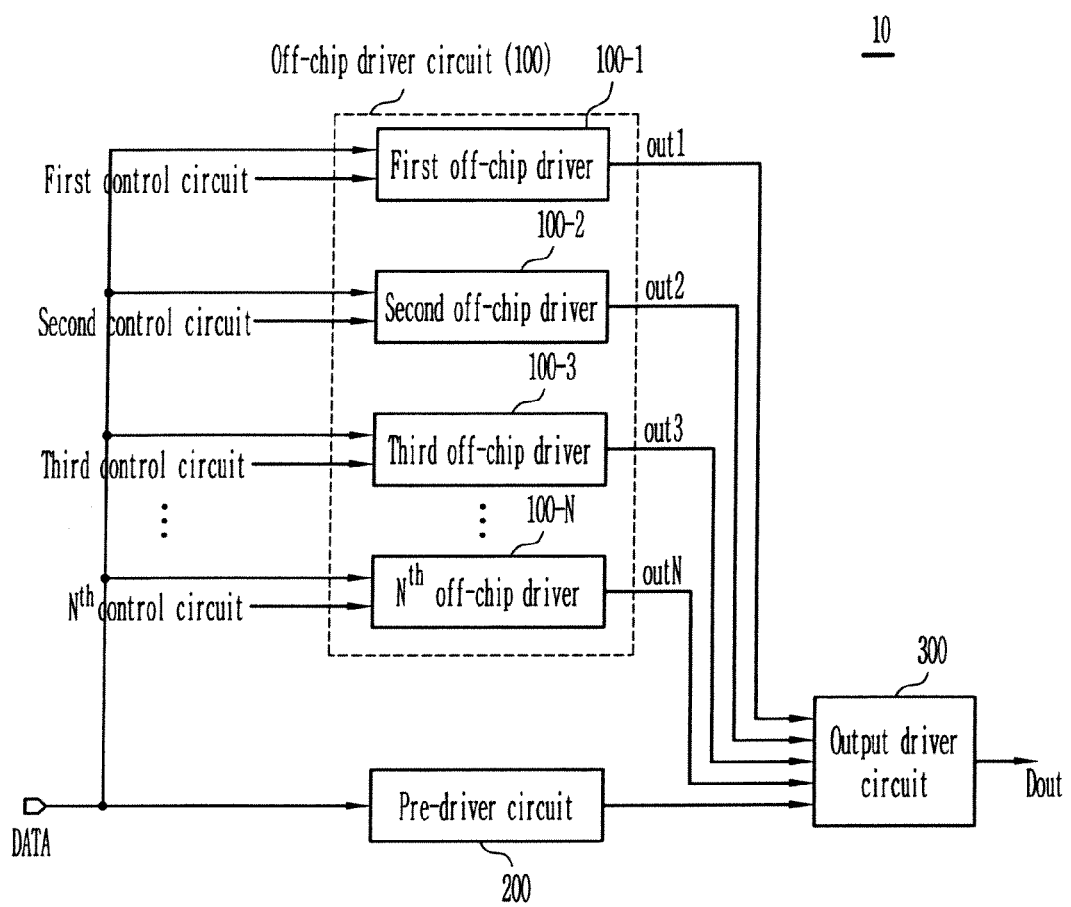
FIG. 1 is a block diagram schematically illustrating the configuration of a data output circuit having a pre-driver circuit in a related art.
Figure 2:
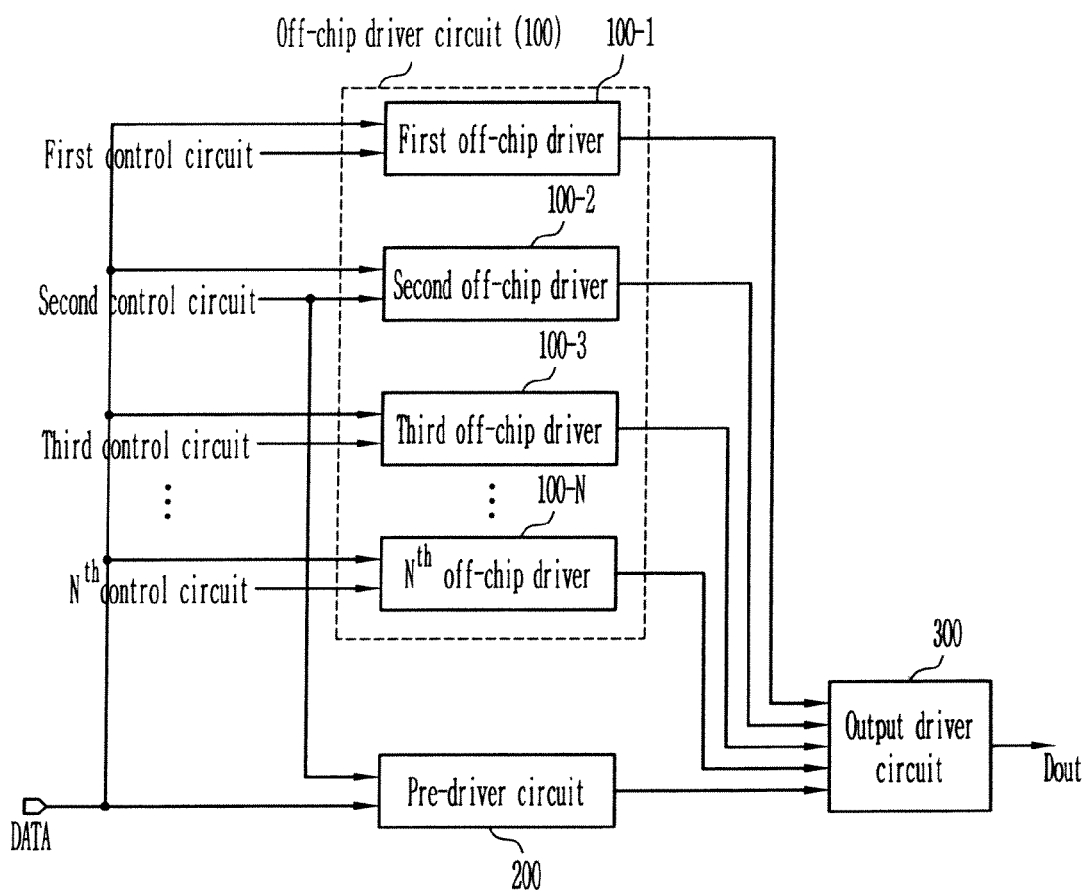
FIG. 2 is a block diagram schematically illustrating the configuration of a data output circuit having a pre-driver circuit according to an embodiment of the present invention.

FIG. 2 is a block diagram schematically illustrating the configuration of a data output circuit having a pre-driver circuit according to an embodiment of the present invention. A data output circuit shown in FIG. 2 includes an off-chip driver circuit 100 having first to $N^{th}$ off-chip drivers 100-1 to 100-N, a pre-driver circuit 200, and an output driver circuit 300 connected to output signals of the off-chip driver circuit 100 and the pre-driver circuit 200. In the above, N is a natural number of 2 or more.

The off-chip driver circuit 100 includes the first to $N^{th}$ off-chip drivers 100-1 to 100-N. Each off-chip driver uses a data signal (DATA) and a corresponding control signal to determine whether to produce an output signal according to the corresponding control signal. The control signal checks a wafer status, after a process is performed, and determines ON/OFF statuses of each off-chip driver based on the check result, thus constructing the first to $N^{th}$ control signals accordingly.

Therefore, it is determined whether each of the off-chip drivers 100-1 to 100-N has to be turned on/off by calibrating the off-chip drivers 100-1 to 100-N from an impedance matching viewpoint for a memory chip of a system. It is thus possible to determine the drivability of the output driver circuit 300 driven by the off-chip drivers 100-1 to 100-N. Whether each off-chip driver must be turned on/off can be controlled by a level of a corresponding control signal. A wafer status is checked and whether each off-chip driver must be turned on/off is then determined based on the check result, thus constructing the first to $N^{th}$ control signals accordingly. The first to $N^{th}$ control signals can be inputted from a chip set (now shown).

Meanwhile, the pre-driver circuit 200 includes a pull-up unit for receiving a data signal, as an input, to output a logical High, a pull-down unit for receiving the data signal, as an input, to output a logical Low, and a control unit for controlling a drive strength of the pull-up unit and/or the pull-down unit using a control signal whose logical status is changed depending on a process completion status. Preferably, the pre-driver circuit 200 employs at least one of the first to $N^{th}$ control signals that determines whether to turn on/off the off-chip driver using a control signal whose logical status is changed depending on a process completion status. Detailed configuration of the pre-driver circuit 200 will be described later.

In FIG. 2, there is shown a case where the pre-driver circuit 200 controls the drive strength by using a second control signal to determine whether to turn on/off the second off-chip driver.

Figure 3:
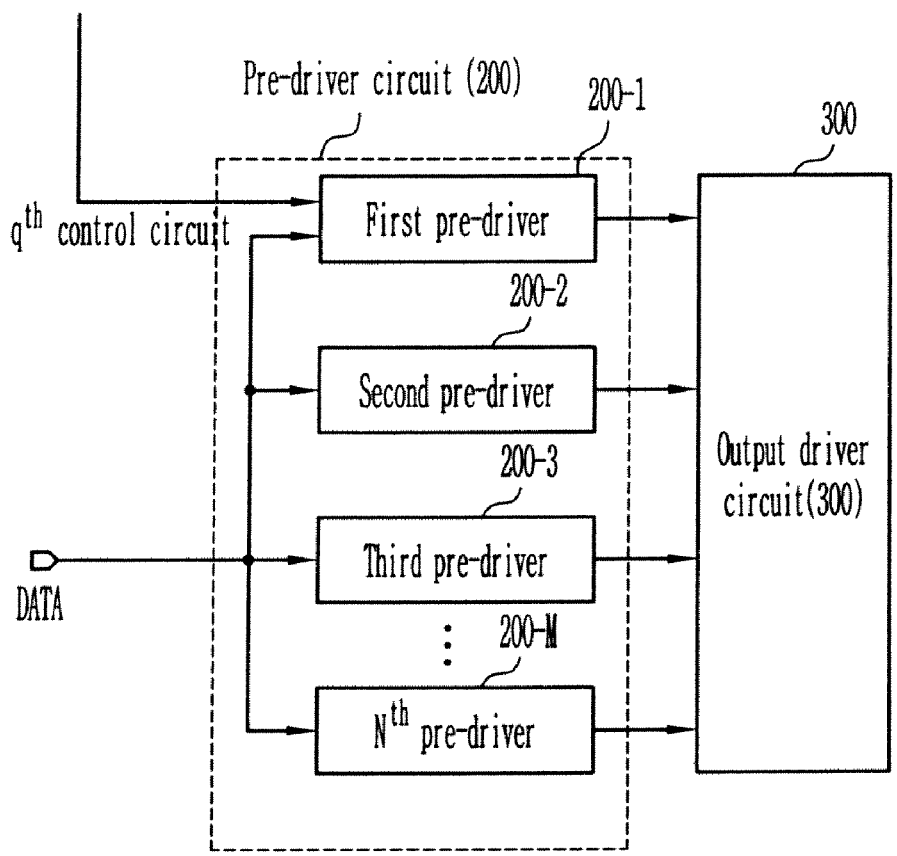
FIG. 3 is an exemplary block diagram for explaining that a pre-driver circuit shown in FIG. 2 determines a drive strength using control signals of off-chip drivers.

FIG. 3 is an exemplary block diagram for explaining that the pre-driver circuit 200 having the first to $M^{th}$ pre-drivers 200-1 to 200-M determines a drive strength by using the first to $N^{th}$ control signals to determine whether to turn on/off the off chip driver. In this case, a $q^{th}$ control signal of the first to $N^{th}$ control signals is inputted to the first pre-driver 200-1 to determine whether to drive the first pre-driver 200-1. It is to be noted that the present prevent is not limited to the above, instead applied to various modes. For example, it is possible to determine whether to drive two or more pre-drivers using one $q^{th}$ control signal. Furthermore, it is possible to determine whether to drive pre-drivers using several control signals.

For instance, one off-chip driver can control the number of an off-chip driver that is turned on/off according to a process completion status on the basis of the drivability of a reference value 100%. For example, in case where it is necessary for the drivability of the entire off-chip driver circuits to reach 110% since a process completion status is somewhat less than a reference value, a corresponding off-chip driver must be turned on in order to satisfy the drivability of 110% other than off-chip drivers that are turned on so as to meet a reference value of 100%. In this case, it is possible to construct the pre-driver circuit so that the drive strength thereof increases using this control signal.

On the contrary, for example, in the event that it is necessary for the drivability of the entire off-chip driver circuits to reach 90% since a process completion status is higher than a reference value 100%, a corresponding off-chip driver needs to be turned off in order to satisfy the drivability of 90%. At this time, it is possible to construct the pre-driver circuit so that the drive strength thereof decreases using this control signal.

Figure 4:
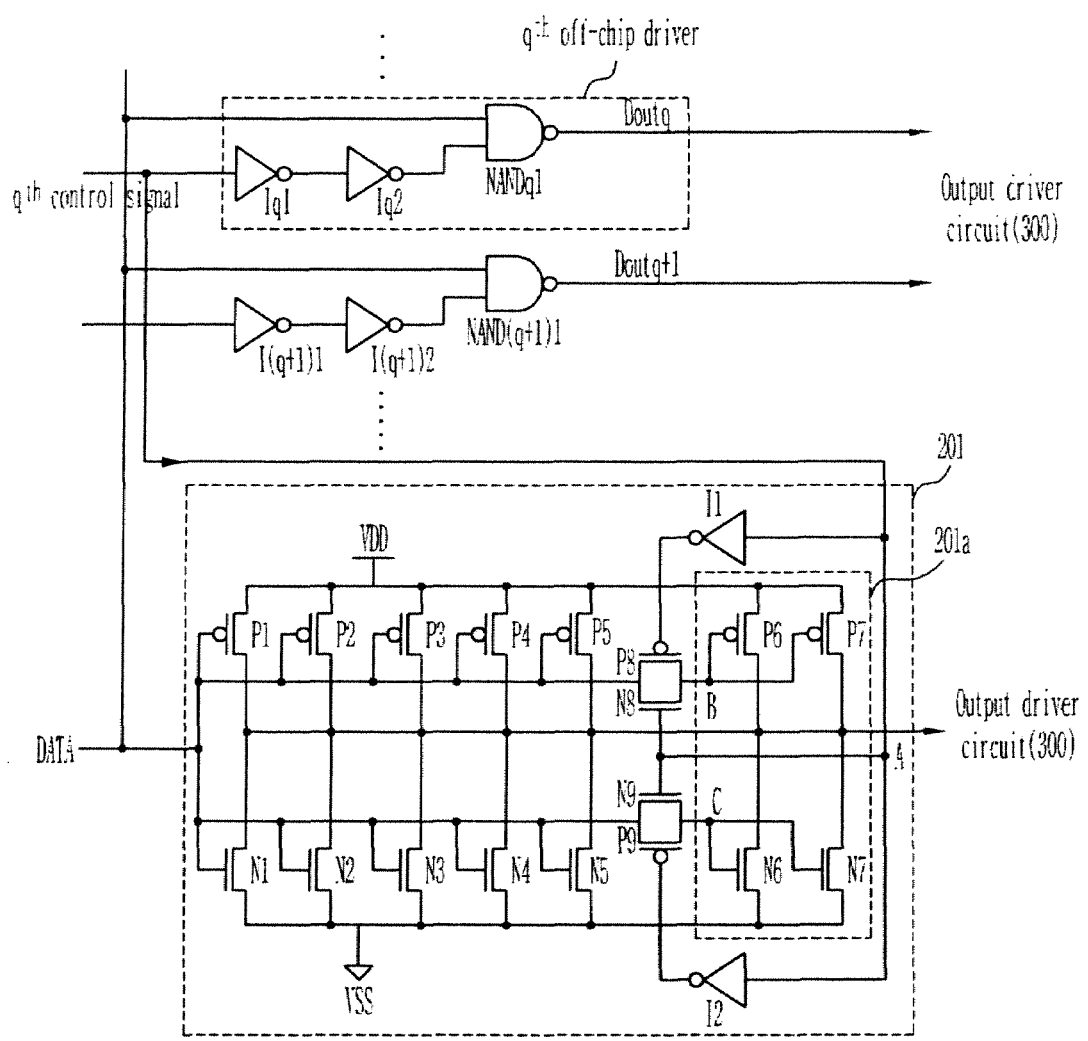
FIG. 4 is an exemplary circuit diagram for reducing a drive strength of a pre-driver circuit by using a control signal to turn off an off-chip driver according to an embodiment of the present invention.

FIG. 4 is an exemplary circuit diagram for reducing a drive strength of a pre-driver circuit by using a control signal to turn off an off-chip driver according to an embodiment of the present invention. For simplicity, there is shown in FIG. 4 that the pre-driver circuit 200 has one pre-driver (having one pull-up unit and one pull-down unit). It is to be, however, noted that the pre-driver circuit 200 may have two or more pre-drivers. In this case, the size of each pre-driver may be differentiated.

Given $q^{th}$ and $q+1^{th}$ off-chip drivers in the off-chip driver circuit 100 includes two inverters Iq1 and Iq2, and Iq+11 and Iq+12 for receiving the data signal, as an input, to output twice-inverted signal, and NAND devices NANDq1 to NANDq+11 for performing an NAND operation for the twice-inverted signal and the data signal (DATA). For example, in order to turn on a corresponding off-chip driver, a corresponding control signal may be inputted as a logical High. In order to turn off a corresponding off-chip driver, a corresponding control signal may be inputted as a logical Low.

The operation of the off-chip driver circuit will be described as follows. If a data signal (DATA) is inputted as a logical High, the same logical High is inputted to one terminal of each off-chip driver. If a control signal inputted to the other terminal thereof is inputted as a logical High, a signal outputted through an NAND device becomes a logical Low. If a control signal inputted to the other terminal is inputted as a logical Low, a signal outputted through an NAND device becomes a logical High. These output signals drive the output driver circuit 300. A portion of the output driver circuit 300 connected to the off-chip driver drives a PMOS device of an output driver circuit when the output signal is logically Low.

The pre-driver circuit 200 includes pull-up units P1 to P7, pull-down units N1 to N7, and control units I1, I2, P7, P8, N7 and N8. The pull-up units P1 to P7 and the pull-down units N1 to N7 use the data signal (DATA) to perform a pull-up or pull down function according to a logical level of the inputted data signal. The pull-up units P1 to P7 include a plurality of PMOSs each having a source and drain connected in parallel between the power supply voltage and an output terminal, and a gate connected to the data signal. The pull-down units N1 to N7 consist of a plurality of NMOSs each having a source and drain connected in parallel between a ground voltage and the output terminal, and a gate connected to the data signal. Although it is shown in FIG. 4 that seven PMOSs and NMOSs are shown, the number of the PMOSs and NMOSs may be varied. The control unit comprises two inverters I1 and I2 and two pass-gates P8, N8, P9 and N9. However, node B and node C are connected to each other. Therefore, the control unit operates normally even if the control unit only comprises an inverter and a pass gate. Namely, FIG. 4 shows two inverters (I1 and I2) and two pass-gates (P8, N8, P9 and N9). A first pre-driver 200-1 of the pre-driver circuit 200 is connected to a corresponding output driver of the output driver circuit 300 to drive the output driver.

Referring to FIG. 4, a $q^{th}$ control signal is inputted to the pre-driver 200-1. This signal controls ON/OFF of the PMOS transistors P6, P7 and the NMOS transistors N6, N7 through the control units I1, P8, N8, I2, P9 and N9. In the concrete, if the data signal is inputted as a logical High and the control signal to turn off the $q^{th}$ off-chip driver is inputted as a logical Low, the NMOSs N1 to N5 constituting the pull-down unit pulls down the output signal by means of the data signal of the logical High. Furthermore, if the $q^{th}$ control signal is inputted as a logical Low, the pre-driver circuit is constructed so that the drive strength is reduced by turning off all the NMOSs N6, N7 and the PMOSs P6, P7 of a drive strength regulating unit 201a through the control units.

As a result, if a total size of the pre-driver is reduced, pan-out with the output driver becomes large. For example, a slew rate is decreased in a state where a process is advantageously completed (FAST CONDITION).

Meanwhile, although there is shown in FIG. 4 that the off-chip driver circuit is constructed so that all the NMOS transistors N6, N7 and the PMOS transistors P6, P7 are turned off, it may be constructed so that only the NMOS transistors N6, N7 or PMOS transistors P6, P7 is turned off. Alternately, the off-chip driver circuit may be constructed so that the NMOS transistors N6, N7 and/or the PMOS transistors P6, P7 is turned on.

Figure 5:
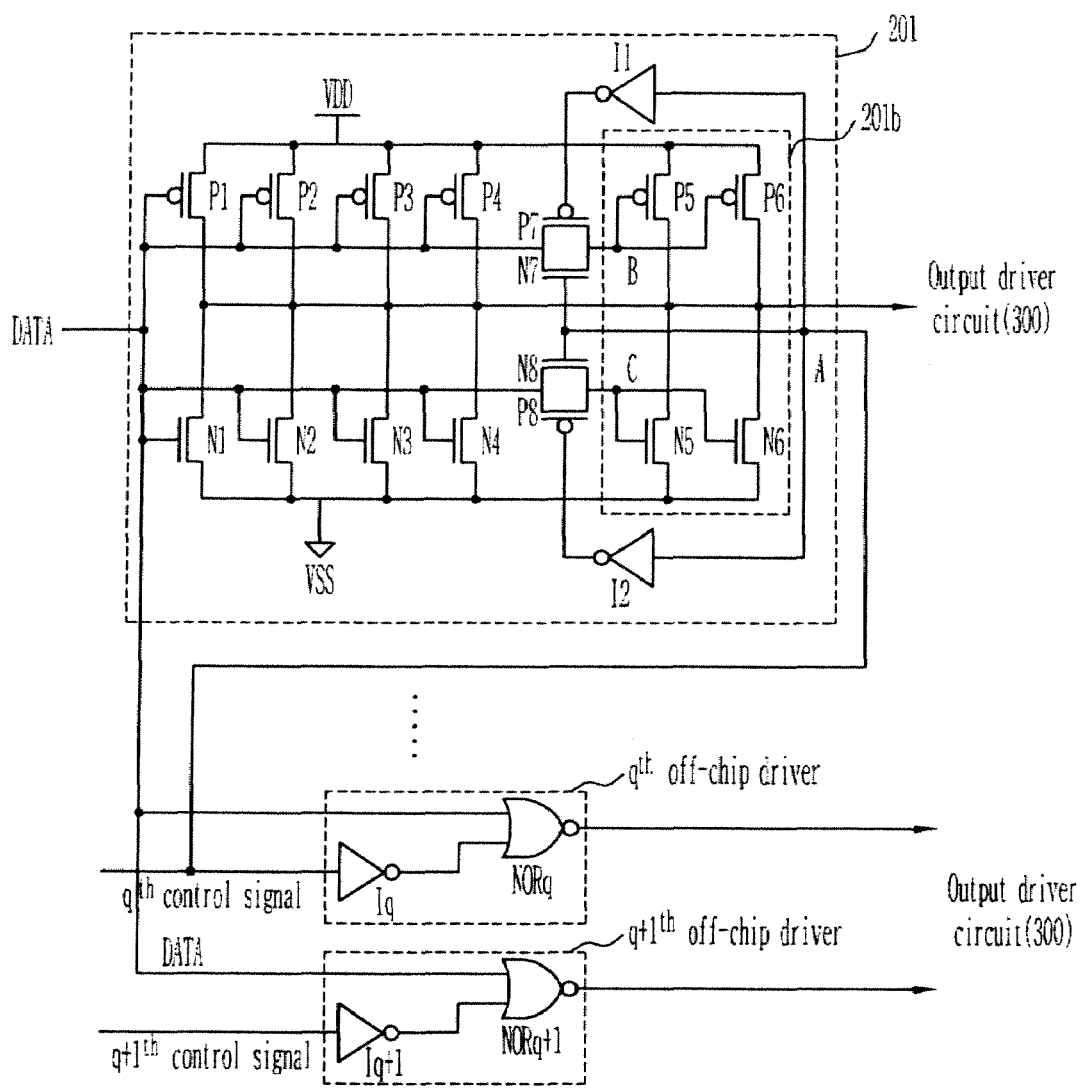
FIG. 5 is an exemplary circuit diagram for increasing a drive strength of a pre-driver circuit by using a control signal to turn on off-chip drivers according to an embodiment of the present invention.

FIG. 5 is an exemplary circuit diagram for increasing a drive strength of a pre-driver circuit by using a control signal to turn on off-chip drivers according to an embodiment of the present invention.

Referring to FIG. 5, the off-chip drivers 100-1 to 100-N of the off-chip driver circuit 200 each includes inverters INV21 to INV2N for receiving the control signals (first to $N^{th}$ control signals), as an input, to output inverted signals, and NOR devices NOR2 to NOR2N for performing a NOR operation for the inverted signals and the data signal (DATA). In order to turn on a corresponding off-chip driver, a corresponding control signal may be inputted as a logical High. In order to turn off a corresponding off-chip driver, a corresponding control signal may be inputted as a logical Low.

The operation of the off-chip driver circuit will be described as follows. If a data signal (DATA) is inputted as a logical Low, the data signal (DATA) of the logical Low is inputted to one terminal of each of the off-chip drivers. If a control signal inputted to the other terminal thereof is inputted as a logical High, a signal outputted through a corresponding NAND device becomes a logical High. If a control signal inputted to the other terminal is inputted as a logical Low, a signal outputted through an NAND device becomes a logical High. These output signals drive the output driver circuit 300.

Referring to FIG. 5, a $q^{th}$ control signal is inputted to the pre-driver 200-1. This signal controls ON/OFF of the PMOS transistors P5, P6 and the NMOS transistors N5, N6 through the control units I1, P7, N7, I2, P8 and N8. In the concrete, if the data signal is inputted as a logical Low and a control signal to turn on the $q^{th}$ off-chip driver is inputted as a logical High, the PMOSs P1 to P4 constituting the pull-up units pulls up the output by means of the data signal of the logical Low. Furthermore, if the $q^{th}$ control signal is inputted as a logical High, the pre-driver circuit is constructed so that the drive strength is increased by turning on the pass-gates N7, P7 and the PMOSs P5, P6 of a drive strength regulating unit 201b through the control units.

As a result, if a total size of the pre-driver is increased, pan-out with the output driver becomes small. For example, a slew rate is increased in a state where a process is somewhat disadvantageously completed (LOW CONDITION).

Meanwhile, although there is shown in FIG. 5 that the off-chip driver circuit is constructed so that the PMOS transistors P5, P6 are turned on, it may be constructed so that only the NMOS transistors N5, N6 is turned on. Alternately, the off-chip driver circuit may be constructed so that the NMOS transistors N5, N6 and/or the PMOS transistors P5, P6 is turned off.

As described above, in the case of FAST CONDITION, the drive strength of a pre-driver may be constructed to become smaller. In the case of LOW CONDITION, the drive strength of a pre-driver may be constructed to become greater. In addition, in order to make smaller the drive strength of the pre-driver circuit, OFF control signals of an off-chip driver out of the off-chip drivers, which is used to adjust the drive strength below a reference size (at the time of 100% drivability), may be used. Meanwhile, in order to make greater the drive strength of the pre-driver circuit, ON control signals of an off-chip driver out of the off-chip drivers, which is used to adjust the drive strength over a reference size (at the time of 100% drivability), may be used.

According to the present invention described above, slew of a waveform of an output data can be stably secured regardless of a process condition, thereby improving signal integrity. Therefore, the present invention has advantageous effects that the entire system is stabilized with a simple logic and additional devices and introduction of concepts are unnecessary.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A data output circuit including a pre-driver circuit, the pre-driver circuit comprising:

a plurality of pull-up elements for outputting a power supply voltage to an output terminal in response to a data signal, wherein the pull-up elements are connected in parallel with each other, and wherein each of the plurality of pull-up elements are coupled directly to the data signal for controlling operation of the plurality of pull-up elements;

a plurality of pull-down elements for outputting a ground voltage to the output terminal in response to the data signal, wherein the pull-down elements are connected in parallel with each other, and wherein each of the plurality of pull-down elements are coupled directly to the data signal for controlling operation of the plurality of pull-up elements;

a drive strength regulating unit for outputting to the output terminal the power supply voltage in response to a low level of the data signal and the ground voltage in response to a high level of the data signal; and a control unit for transferring the data signal to the drive strength regulating unit in response to a control signal, wherein in response to inactivation of the control signal, the control unit does not transfer the data signals to the drive strength regulating unit and the drive strength regulating unit is not operated, and wherein in response to activation of the control signal, the control unit transfers the data signals to the drive strength regulating unit and the drive strength regulating unit is operated during the operation of the pull-up elements or the pull-down elements to increase a drive strength.

2. The data output circuit as claimed in claim 1, wherein the drive strength regulating unit comprises first drive strength regulating unit for outputting the power supply voltage in response to the data signal transferred by the control unit, and
second drive strength regulating unit for outputting the ground voltage in response to the data signal transferred by the control unit.

3. The data output circuit as claimed in claim 2, wherein the first drive strength regulating unit comprises a plurality of PMOS devices which are connected in parallel between a power supply voltage terminal and the output terminal, and operated in response to the data signal transferred by the control unit; and
the second drive strength regulating unit comprises a plurality of NMOS devices which are connected in parallel between a ground voltage terminal and the output terminal, and operated in response to the data signal received from the control unit.

4. The data output circuit as claimed in claim 1, wherein the pull-up elements comprise a plurality of PMOS devices each having a source and drain connected in parallel between a power supply voltage terminal and an output terminal, and a gate connected to receive the data signal; and
the pull-down elements comprises a plurality of NMOS devices each having a source and drain connected in parallel between a ground voltage terminal and the output terminal, and a gate connected to receive the data signal.

5. The data output circuit as claimed in claim 1, wherein the control unit comprises:
an inverter for inverting the control signal; and
a transmission gate for being switched by the control signal and its inverse signal.

6. A data output circuit, comprising:
an off-chip driver circuit having a plurality of off-chip drivers for respectively receiving a data signal and generating respective output signals in response to respective control signals;
a pre-driver circuit for receiving the data signal and at least one of the control signals and driving an output driver circuit, the pre-driver circuit comprising,
a plurality of pull-up elements for outputting a power supply voltage to the output driver circuit in response to the data signal, wherein the pull-up elements are connected in parallel with each other,
a plurality of pull-down elements for outputting a ground voltage to the output driver circuit in response to the data signal, wherein the pull-down elements are connected in parallel with each other,
a drive strength regulating unit for outputting the power supply voltage or the ground voltage to the output driver circuit in response to the data signal, and
a control unit for transferring the data signal to the drive strength regulating unit in response to the respective control signal which is used for determining a drive strength; and
wherein the output driver circuit is connected to outputs of the off-chip driver circuit and to an output terminal of the pre-driver circuit,
wherein when the control signal has a first state, the control unit does not transfer the data signals to the drive strength regulating unit and the drive strength regulating unit is not operated, and
wherein when the control signal has a second state, the control unit transfers the data signals to the drive strength regulating unit and the drive strength regulating unit is operated during the operation of the pull-up elements or the pull-down elements to increase the drive strength.

7. The data output circuit as claimed in claim 6, wherein the off-chip driver comprises:
a first inverter for inverting the respective control signal;
a second inverter for inverting an output of the first inverter; and
an NAND gate for outputting the output signal in response to the data signal and an output of the second inverter.

8. The data output circuit as claimed in claim 6, wherein the drive strength regulating unit comprises:
a first drive strength regulating unit for outputting the power supply voltage to the output driver in response to the data signal transferred by the control unit, and
a second drive strength regulating unit for outputting the ground voltage to the output driver in response to the data signal transferred by the control unit.

9. The data output circuit as claimed in claim 8, wherein the first drive strength regulating unit comprises a plurality of PMOS devices which are connected in parallel between a power supply voltage terminal and the output terminal, and operated in response to the data signal transferred by the control unit, and wherein the second drive strength regulating unit comprises a plurality of NMOS devices which are connected in parallel between a ground voltage terminal and the output terminal, and operated in response to the data signal transferred by the control unit.

10. The data output circuit as claimed in claim 6, wherein the pull-up elements comprises a plurality of PMOS devices which are connected in parallel between a power supply voltage terminal and the output terminal, and operated in response to the data signal; and
the pull-down elements comprises a plurality of NMOS devices which are connected in parallel between a ground voltage terminal and the output terminal, and operated in response to the data signal.

11. The data output circuit as claimed in claim 6, wherein the control unit comprises:
an inverter for inverting the respective control signal; and
a transmission gate for being switched by the respective control signal and an inverse of the control signal.

12. The data output circuit as claimed in claim 6, wherein the off-chip driver comprises:
an inverter for inverting the respective control signal; and
an NOR gate for outputting the output signal in response to the data signal and an output of the inverter.

13. A data output circuit, comprising:
an off-chip driver circuit having a plurality of off-chip drivers for respectively receiving a data signal and generating respective output signals in response to respective control signals;
a pre-driver circuit for receiving the data signal and at least one of the control signals and driving an output driver circuit, where the pre-driver circuit comprises,
a plurality of pull-up elements connected between a power supply voltage terminal and an output terminal of the pre-driver circuit for outputting a power supply voltage to the output driver circuit in response to the data signal, wherein the pull-up elements are connected in parallel with each other,
a plurality of pull-down elements connected between a ground voltage terminal and the output terminal of the pre-driver circuit for outputting a ground voltage to the output driver circuit in response to the data signal, wherein the pull-down elements are connected in parallel with each other, and a control unit comprising an inverter for inverting the at least one of the control signals and a transmission gate for being switched by the at least one of the control signals and an output signal of the inverter, for transferring the data signal to a drive strength regulating unit in response to the at least one of the control signals, wherein the drive strength regulating unit is connected between the power supply voltage terminal and the ground voltage terminal, and outputs the power supply voltage or the ground voltage to the output driver circuit in response to the data signal transferred by the control unit; and the output driver circuit connected to outputs of the off-chip driver circuit and the output terminal of the pre-driver circuit.

14. The data output circuit as claimed in claim 13, wherein the drive strength regulating unit comprises:

a first drive strength regulating unit for outputting the power supply voltage to the output driver in response to the data signal transferred by the control unit, and a second drive strength regulating unit for outputting the ground voltage to the output driver in response to the data signal transferred by the control unit.

15. The data output circuit as claimed in claim 14, wherein the first drive strength regulating unit comprises a plurality of PMOS devices which are connected in parallel between a power supply voltage terminal and the output terminal, and operated in response to the data signal transferred by the control unit, and wherein the second drive strength regulating unit comprises a plurality of NMOS devices which are connected in parallel between a ground voltage terminal and the output terminal, and operated in response to the data signal transferred by the control unit.

16. A data output circuit comprising:

an off-chip driver circuit having a plurality of off-chip drivers for respectively receiving a data signal and generating respective output signals in response to a respective control signal; and a pre-driver circuit, the pre-driver circuit comprising:

a plurality of inverters receiving the data signal, respectively, and then outputting an inverted data signal to an output terminal, which are connected in parallel between a power supply voltage terminal and a ground voltage terminal;

a control unit for transferring the data signal in response to the control signal that determines a drive strength; and a drive strength regulating unit for outputting a power supply voltage or a ground voltage to the output terminal together with the inverted data signal when the control signal transferred from the control unit is inputted.

17. The data output circuit as claimed in claim 16, wherein the drive strength regulating unit comprises first drive strength regulating unit for outputting the power supply voltage to the output terminal in response to the data signal transferred by the control unit, and second drive strength regulating unit for outputting the ground voltage to the output terminal in response to the data signal transferred by the control unit.

18. The data output circuit as claimed in claim 17, wherein the first drive strength regulating unit comprises a plurality of PMOS devices which are connected in parallel between the power supply voltage terminal and the output terminal, and operated in response to the data signal transferred by the control unit; and the second drive strength regulating unit comprises a plurality of NMOS devices which are connected in parallel between the ground voltage terminal and the output terminal, and operated in response to the data signal received from the control unit.

19. The data output circuit as claimed in claim 16, wherein the drive strength regulating unit outputs the power supply voltage when the data signal transferred from the control unit is low level, and outputs the ground voltage when the data signal transferred from the control unit is high level.

* * * * *

UNITED STATES PATENT AND TRADEMARK OFFICE
CERTIFICATE OF CORRECTION

| | |
|---|---|
| PATENT NO. | : 7,477,081 B2 |
| APPLICATION NO. | : 10/737622 |
| DATED | : January 13, 2009 |
| INVENTOR(S) | : Ho Uk Song |

It is certified that error appears in the above-identified patent and that said Letters Patent is hereby corrected as shown below:

In the Claims:

At Column 7, line 24 claim 4, "comprises" should be -- comprise --.

At Column 8, line 34 claim 10, "comprises" should be -- comprise --.

Signed and Sealed this

Second Day of June, 2009

JOHN DOLL
*Acting Director of the United States Patent and Trademark Office*